(12) United States Patent
Zhou et al.

(10) Patent No.: US 11,728,639 B2
(45) Date of Patent: Aug. 15, 2023

(54) TRANSFORMER SHORT-CIRCUIT PROTECTION METHOD AND TRANSFORMER SHORT-CIRCUIT PROTECTION DEVICE

(71) Applicant: Delta Electronics (Shanghai) Co., Ltd., Shanghai (CN)

(72) Inventors: Zehua Zhou, Shanghai (CN); Shengzou Yue, Shanghai (CN); Hongyang Wu, Shanghai (CN); Liping Sun, Shanghai (CN); Qianfeng Li, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/453,491

(22) Filed: Nov. 4, 2021

(65) Prior Publication Data

US 2022/0149612 A1    May 12, 2022

(30) Foreign Application Priority Data

Nov. 12, 2020    (CN) .................. 202011260069.X

(51) Int. Cl.
*H02H 7/04*    (2006.01)
*G01R 31/62*    (2020.01)

(52) U.S. Cl.
CPC ............... *H02H 7/04* (2013.01); *G01R 31/62* (2020.01)

(58) Field of Classification Search
CPC .................... H02H 7/04; G01R 31/62
See application file for complete search history.

(56) References Cited

U.S. PATENT DOCUMENTS

| 3,195,015 A | * | 7/1965 | Astleford, Jr. | ........ H01F 27/402 |
| | | | | 337/72 |
| 2011/0205770 A1 | * | 8/2011 | Isogai | ..................... H02M 1/32 |
| | | | | 363/78 |

FOREIGN PATENT DOCUMENTS

| CN | 101800414 B | 8/2012 |
| CN | 108051691 A | 5/2018 |
| CN | 110749838 A | 2/2020 |

* cited by examiner

*Primary Examiner* — Scott Bauer
(74) *Attorney, Agent, or Firm* — CKC & Partners Co., LLC

(57) ABSTRACT

The invention provides a transformer short-circuit protection method and a transformer short-circuit protection device. The transformer short-circuit protection method includes: acquiring output voltages of a plurality of output lines of at least one winding on a low-voltage side of a transformer; and determining a short circuit according to the output voltages, and sending a protection signal when the short circuit is determined.

16 Claims, 10 Drawing Sheets

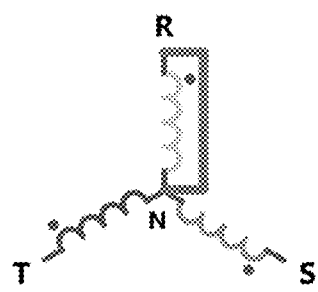
FIG.7A
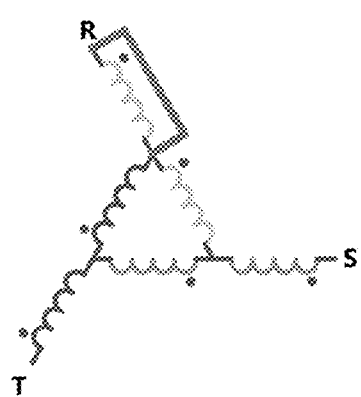 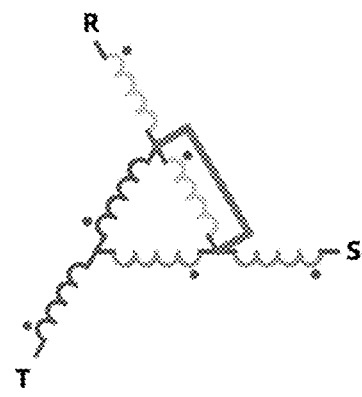 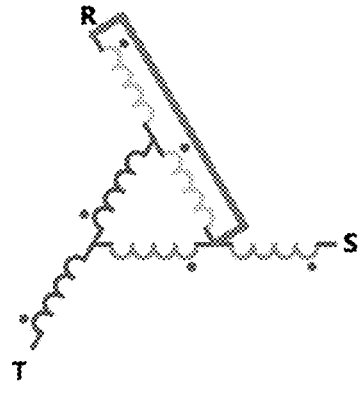
FIG.7B  FIG.7C  FIG.7D
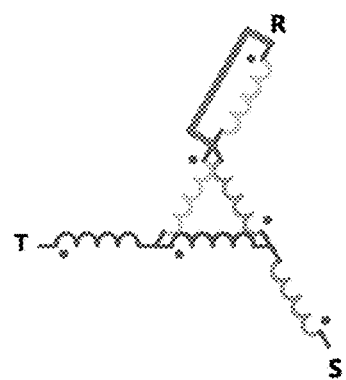 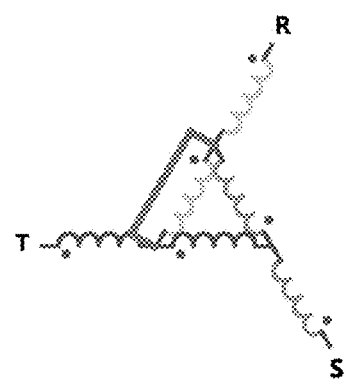 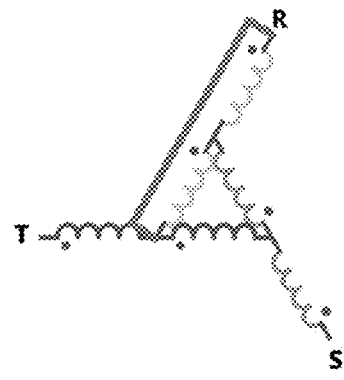
FIG.7E  FIG.7F  FIG.7G

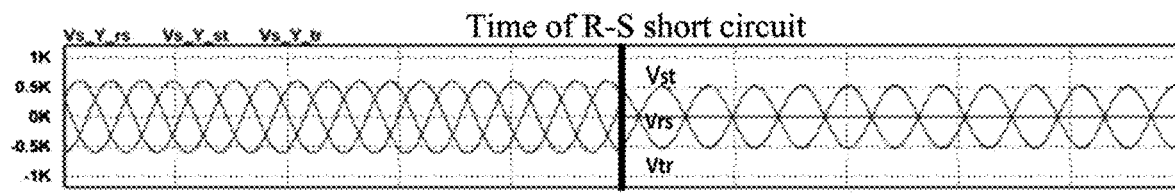
FIG.8A
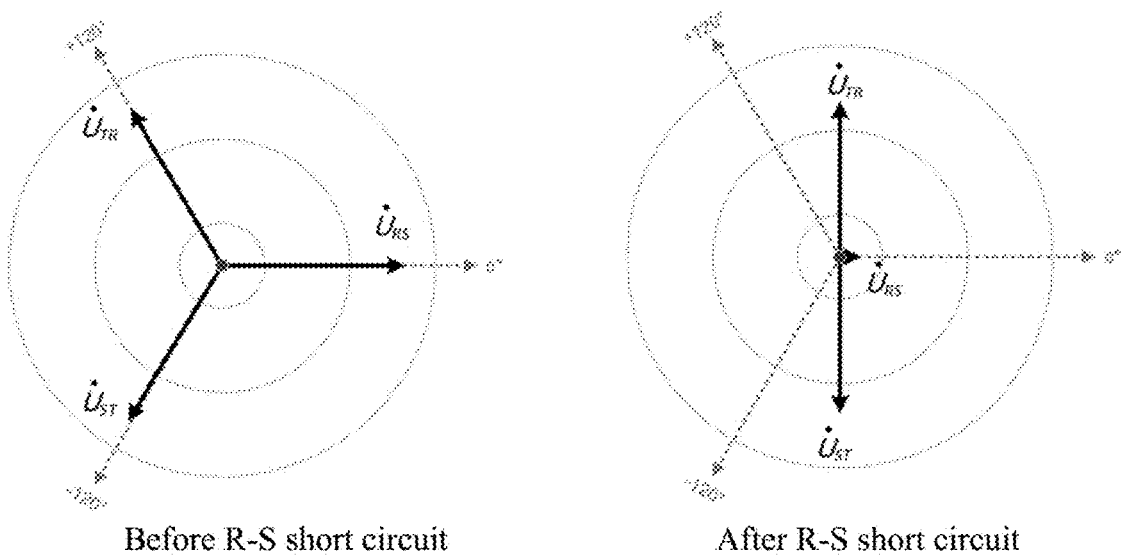
Before R-S short circuit
FIG.8B
After R-S short circuit
FIG.8C
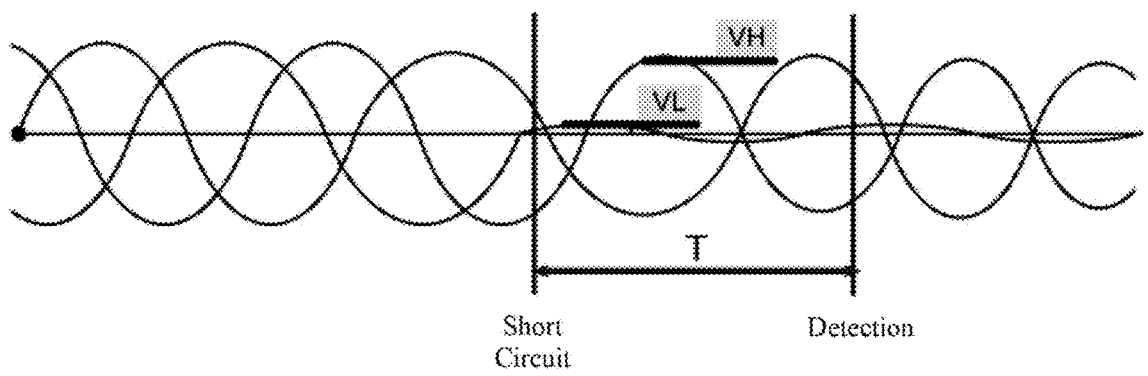
FIG.8D Before R phase short circuit of an extended winding After R phase short circuit of an extended winding

TRANSFORMER SHORT-CIRCUIT PROTECTION METHOD AND TRANSFORMER SHORT-CIRCUIT PROTECTION DEVICE

CROSS-REFERENCE TO RELATED APPLICATIONS

This non-provisional application claims priority under 35 U.S.C. § 119(a) on Patent Application No. 202011260069.X filed in P.R. China on Nov. 12, 2020, the entire contents of which are hereby incorporated by reference.

BACKGROUND OF THE INVENTION

Field of the Invention

The invention relates to a technical field of power electronics, and particularly to a transformer short-circuit protection method and a transformer short-circuit protection device.

Related Art

Short-circuit fault is a common and serious fault in a power system. When the short circuit fault occurs, if a protection is not performed timely and efficiently, bad accidents that threaten property and personal security may be caused, so short-circuit protection is indispensable.

As a conventional short-circuit protection on a low-voltage side of a three-phase transformer in the power system, a circuit breaker is connected to an output distribution terminal on the low-voltage side for protecting by hardware, or a current sensor for sensing current is connected to the output distribution terminal on the low-voltage side for protecting by software.

In most cases, when a post-distribution line has a short-circuit fault, current flowing through the circuit breaker increases suddenly to several or dozens of times of a rated current, so the circuit breaker disconnects the line to realize short-circuit protection.

However, the requirement for transformer short-circuit protection is different in a system having multiple secondary windings. It is inappropriate to perform the same protection based on a current circuit breaker, because the protection cost is greatly increased in the system having multiple secondary windings, and also a protection reliability is affected by a position of the short circuit. If a short-circuit current does not flow through the circuit breaker, the main transformer cannot be effectively protected.

For example, in a 2.4 MW charging system, the main transformer is a 2500 kVA phase-shifting transformer, which is provided with a power from a 12.5 kV medium-voltage power grid and supplies a low voltage AC power to a plurality of chargers through a phase-shifting transformer having forty-nine windings at a low-voltage side. The phase-shifting transformer has functions of isolating input and reducing Total Harmonic Distortion (THD). A short-circuit impedance of the transformer is about 7%. When the short circuit occurs on the winding at the low-voltage side, a short-circuit current exceeding twelve times of the rated current is generated in the winding while generating a large amount of electrodynamic power and heating. If a protection is not performed timely, the whole transformer may be damaged.

If the protection based on current is performed in the above charging system or the power distribution system having multiple outputs from windings, the following disadvantages exist:

(1) If a hardware protection is performed in a transformer having N windings at the low-voltage side, N three-phase circuit breakers are required. When the system needs a software protection and reports the short circuit fault, 3*N current sensors are required. When N is a large number, the cost for detection and protection is largely increased.

(2) Generally, the current sensor and the circuit breaker are installed on a distribution terminal of the system, instead of outgoing lines of the transformer. If a short circuit occurs on a line inside the transformer or a line between an output terminal and the circuit breaker, the short-circuit current does not flow through the circuit breaker, and in such case, the short circuit cannot be detected and the protection cannot be performed.

Therefore, it is urgent to provide a novel transformer short-circuit protection method and a novel transformer short-circuit protection device, which can efficiently reduce protection cost and improve protection reliability.

SUMMARY OF THE INVENTION

An object of the invention is to provide a transformer short-circuit protection method and a transformer short-circuit protection device, which can efficiently reduce protection cost and improve protection reliability.

To realize the object, the invention provides a transformer short-circuit protection method. The method includes: acquiring output voltages of a plurality of output lines of at least one winding on a low-voltage side of a transformer; determining a short circuit according to the output voltages; and sending a protection signal when the short circuit is determined.

In one embodiment of the invention, determining the short circuit according to the output voltages includes: computing a plurality of line voltages between each two of the plurality of output lines according to the output voltages; and determining the short circuit when variations of the plurality of line voltages satisfy short-circuit variation characteristics.

In one embodiment of the invention, the short-circuit variation characteristics include an amplitude characteristic in which an amplitude of one of the plurality of line voltages is less than or equal to a first characteristic value within a detection window time, an amplitude of any one of other line voltages is greater than or equal to a second characteristic value within the detection window time, and the first characteristic value is less than the second characteristic value.

In one embodiment of the invention, determining the short circuit includes: (a) respectively comparing amplitudes of the plurality of line voltages with the first characteristic value and the second characteristic value; and (b) determining the short circuit occurring, when the amplitude characteristic is satisfied.

In one embodiment of the invention, the short-circuit variation characteristics further include a phase characteristic in which a phase difference between two of the other line voltages is within an angle range.

In one embodiment of the invention, determining the short circuit includes: (a) respectively comparing amplitudes of the plurality of line voltages with the first characteristic value and the second characteristic value; (b) obtaining a time difference between points at which the other line voltages cross zero in a same direction through zero-crossing detection, computing a phase difference according to the time difference, and determining whether the phase difference is within the angle range; and (c) determining the short circuit occurring, when the amplitude characteristic is satisfied, and the phase characteristic is satisfied once within the detection window time.

In one embodiment of the invention, the at least one winding is a Y-type winding, the first characteristic value is 0, and the second characteristic value is 0.87*Uo; or the first characteristic value is Uo*5%, and the second characteristic value is 0.87*Uo*80%.

In one embodiment of the invention, the at least one winding is an extended triangular winding, the first characteristic value is 0.38*Uo, and the second characteristic value is 0.99*Uo; or the first characteristic value is 0.38*Uo*120%, and the second characteristic value is 0.99*Uo*80%.

In one embodiment of the invention, the protection signal is sent to a controllable circuit breaker on a high-voltage side of the transformer, and the controllable circuit breaker cuts off a connection between the transformer and a power grid after receiving the protection signal.

In one embodiment of the invention, the short-circuit variation characteristics further include a sum of vectors of the plurality of line voltages always being zero.

To realize the object, the invention further provides a transformer short-circuit protection device. The device includes a voltage acquiring unit, a short-circuit determining unit and controllable circuit breaker. The voltage acquiring unit is configured to acquire output voltages of a plurality of output lines of at least one winding on a low-voltage side of a transformer. The short-circuit determining unit is configured to determine a short circuit according to the output voltages, and send a protection signal when the short circuit is determined. The controllable circuit breaker is disposed on a high-voltage side of the transformer and connected to the short-circuit determining unit, for cutting off a connection between the transformer and a power grid after receiving the protection signal.

In another embodiment of the invention, the short-circuit determining unit is connected to a superior system, and configured to report a short circuit fault to the superior system when the short circuit is determined.

In another embodiment of the invention, the short-circuit determining unit is configured to obtain a plurality of line voltages between each two of the plurality of output lines according to the output voltages, and determine the short circuit when variations of the plurality of line voltages satisfy short-circuit variation characteristics.

In another embodiment of the invention, the short-circuit variation characteristics include an amplitude characteristics in which an amplitude of one of the plurality of line voltages is less than or equal to a first characteristic value within a detection window time, an amplitude of any one of other line voltages is greater than or equal to a second characteristic value within the detection window time, and the first characteristic value is less than the second characteristic value.

In another embodiment of the invention, the short-circuit determining unit is configured to: (a) respectively compare amplitudes of the plurality of line voltages with the first characteristic value and the second characteristic value; and (b) determine the short circuit occurring, when the amplitude characteristic is satisfied.

In another embodiment of the invention, the short-circuit variation characteristics further comprises a phase characteristics in which a phase difference between two of the other line voltages is within an angle range.

In another embodiment of the invention, the short-circuit determining unit is configured to: (a) respectively compare amplitudes of the plurality of line voltages with the first characteristic value and the second characteristic value; (b) obtain a time difference between points at which the other line voltages cross zero in a same direction through zero-crossing detection, computing a phase difference according to the time difference, and determining whether the phase difference is within the angle range; and (c) determine the short circuit occurring, when the amplitude characteristic is satisfied, and the phase characteristic is satisfied once within the detection window time.

In another embodiment of the invention, the at least one winding is a Y-type winding, the first characteristic value is 0, and the second characteristic value is 0.87*Uo; or the first characteristic value is Uo*5%, and the second characteristic value is 0.87*Uo*80%.

In another embodiment of the invention, the at least one winding is an extended triangular winding, the first characteristic value is 0.38*Uo, and the second characteristic value is 0.99*Uo; or the first characteristic value is 0.38*Uo*120%, and the second characteristic value is 0.99*Uo*80%.

In one embodiment of the invention, the short-circuit variation characteristics further include a sum of vectors of the plurality of line voltages always being zero.

The invention provides a transformer short-circuit protection method and a transformer short-circuit protection device based on voltage characteristics, which realizes a short-circuit protection for a three-phase transformer by detecting the line voltages, and largely reduces the protection cost and improves the protection reliability.

As compared to the current detection of the prior art, the invention has the following advantages:

(1) The voltage sensor (divider type), when only performing short-circuit protection, has a lower cost than the current sensor, such that the cost is greatly reduced for a system having multiple output windings. If a post-stage device (such as, a charger) has a function of sampling a voltage of power network in real time, the voltage sensor can be omitted. For example, the short-circuit protection can be performed by directly using the voltage sampled by the charger.

(2) The short-circuit protection according to the present invention can be performed through the voltage detection regardless of a position of the short circuit, particularly in a case that the conventional current detection is unfeasible.

(3) A release speed of an overcurrent of the circuit breaker is associated with an amplitude of the current, and the release speed may be slow when the current value is proximate to a protection threshold, thereby increasing a risk of the system. The voltage detection according to the present invention is performed by software, so the time and sensitivity for protection are controllable and stable.

The additional aspects and advantages of the invention are partially explained in the below description, and partially become apparent from the description or can be obtained through practice of the invention.

BRIEF DESCRIPTION OF THE DRAWINGS

The exemplary embodiments will be described in detail with reference to the accompanying drawings, through which the above and other features and advantages of the disclosure will become more apparent.

FIGS. 7A-7G show a phase short circuit or a partial winding short circuit occurring on different types of windings of a three-phase transformer according to the invention, respectively.

FIG. 8A is a waveform diagram showing a variation of line voltages between three output lines before and after a short circuit occurring on a R-S line of a Y-type winding of a three-phase transformer as shown in FIG. 6A.

FIGS. 8B and 8C are diagrams showing vectors before and after the short circuit, respectively.

FIG. 8D is a schematic diagram showing a determination of a short circuit by detecting output voltages of output lines of a short-circuit winding.

DETAILED EMBODIMENTS OF THE INVENTION

Figure 1A:
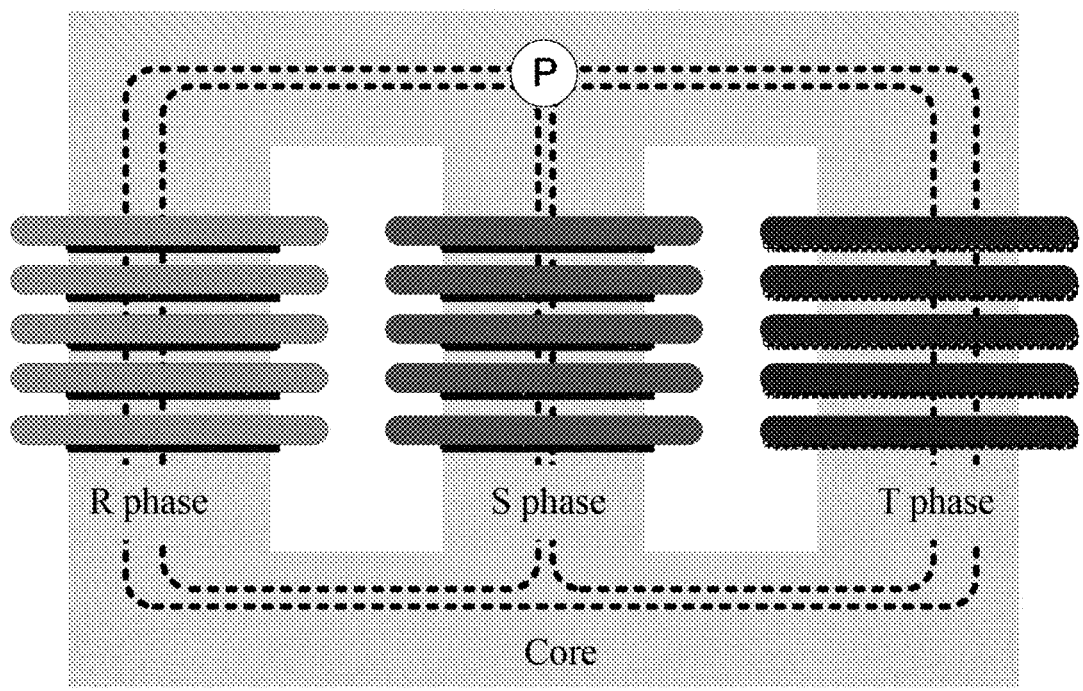
FIG. 1A is a diagram showing magnetic paths of a three-phase transformer which normally operates.

The exemplary embodiments will be described fully with reference to the accompanying drawings. However, the exemplary embodiments can be implemented in various forms and shall not be understood as being limited to the embodiments set forth herein. On the contrary, these embodiments are provided so that this invention will be thorough and complete, and the conception of exemplary embodiments will be fully conveyed to those skilled in the art. In the drawings, the same reference sign denotes the same or similar element, so the detailed description will be omitted.

When elements/components/the like described and/or illustrated here are introduced, the phrases "a", "an", "the", "said" and "at least one" refer to one or more elements/components/the like. The terms "include", "comprise" and "have" refer to an open and included meaning, and additional elements/components/the like may exist, in addition to the listed elements/components/the like. Relative phrases, such as, "upper" or "lower" may be used to describe a relative relation between one component and another component. It shall be understood that if the device in the drawings is turned upside down, an illustrated component on an "upper" side will become a component on a "lower" side. In addition, the terms "first", "second" and the like in the claims are only used as signs, instead of numeral limitations to objects.

The invention mainly provides a transformer short-circuit protection method and a transformer short-circuit protection device based on line voltages. When a short circuit occurs inside the transformer, characteristics of three line voltages of the output winding may be changed. Therefore, the short circuit can be determined for performing protection by detecting RMS values (instantaneous values) of the line voltages, without requiring a detection of current. Moreover, different types of short circuit can be accurately determined by analyzing amplitudes and phases of the line voltages based on vector characteristics.

Figure 1B:
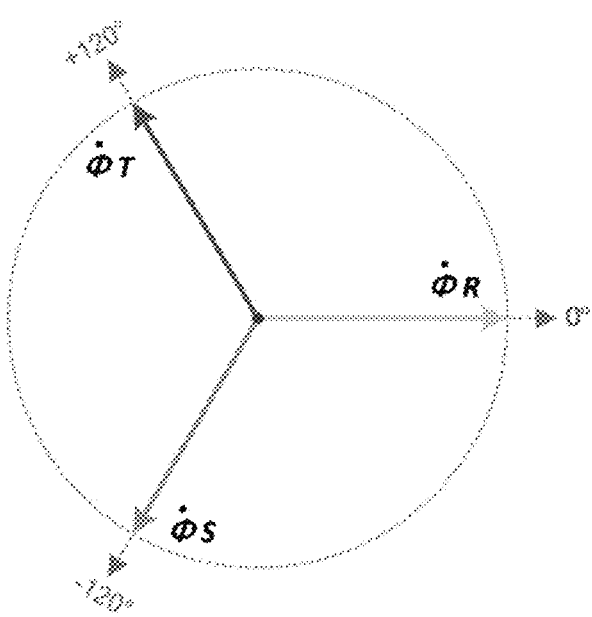
FIG. 1B is a diagram showing vectors of a three-phase transformer which normally operates.

FIG. 1A shows magnetic paths of a three-phase transformer which normally operates. The three-phase transformer includes three core columns on which a R phase winding, a S phase winding and a T phase winding are wound, respectively. FIG. 1A shows the magnetic paths of these windings. When the three-phase transformer normally operates, components $\phi_R$, $\phi_S$ and $\phi_T$ of a synthetic magnetic flux generated by currents of all windings on the three core columns have a phase difference of 120° and a same amplitude, as shown in FIG. 1B. And an induced electromotive force on the windings satisfies:

$$u_e = -N\frac{d\phi}{dt} = U_m \cos(\omega \varepsilon + \varphi_U).$$

Therefore, terminal voltages on the windings and magnetic flux surrounded by the windings are varied in a same manner over time.

Further, according to a principle of continuity of a magnetic flux:

$$\oint_S \vec{R} \cdot d\vec{S} = 0.$$

A total magnetic flux at a node P of the magnetic path is 0, as shown in FIG. 1A. That is, a sum of components of the three phases magnetic flux is 0:

$$\phi_R + \phi_S + \phi_T = 0.$$

Figure 2A:
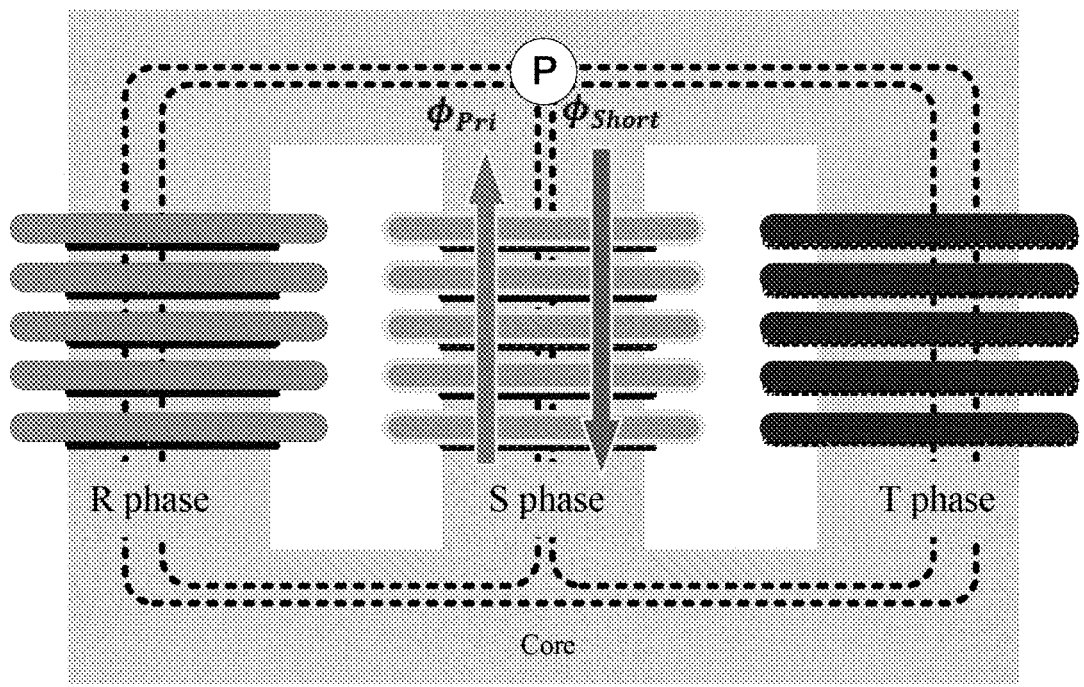
FIG. 2A is a diagram showing magnetic paths of a three-phase transformer in which a short circuit occurs on S phase.

FIG. 2A shows magnetic paths of a three-phase transformer in which a short circuit occurs on S phase. When a short circuit occurs on the S phase winding, coils of the winding form a closed loop having a small impedance to induce a very large loop current and a terminal voltage is proximate to 0. Meanwhile, a magnetic flux $\phi_{Short}$ in a direction opposite to that of a primary magnetic flux $\phi_{Pri}$ is generated by an annular short-circuit current of the winding, as shown in FIG. 2A, and a synthetic magnetic flux of the S phase is proximate to 0.

Moreover, the component $\phi_S$ at the node P of the magnetic path is decreased to 0, and other components still satisfy:

$\phi_R+\phi_T=0$.

Figure 2B:
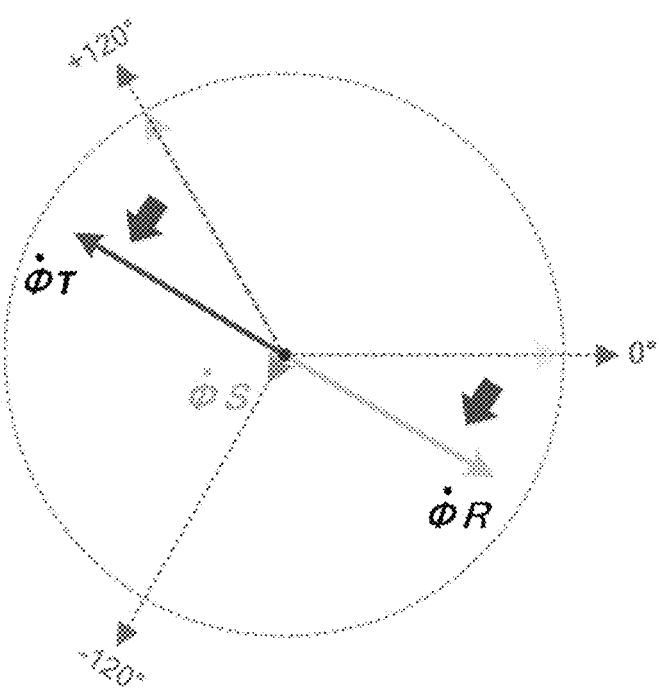
FIG. 2B is a diagram showing vectors of a three-phase transformer in which a short circuit occurs on S phase.

That is, $\phi_R$ and $\phi_T$ are varied to two components having a phase difference of 180° and a same amplitude, as shown in FIG. 2B. Phase voltages are varied correspondingly, and a variation of the synthesized line voltage is associated with a connection types of the windings, but a sum of vectors is always zero.

Figures 3, 4:
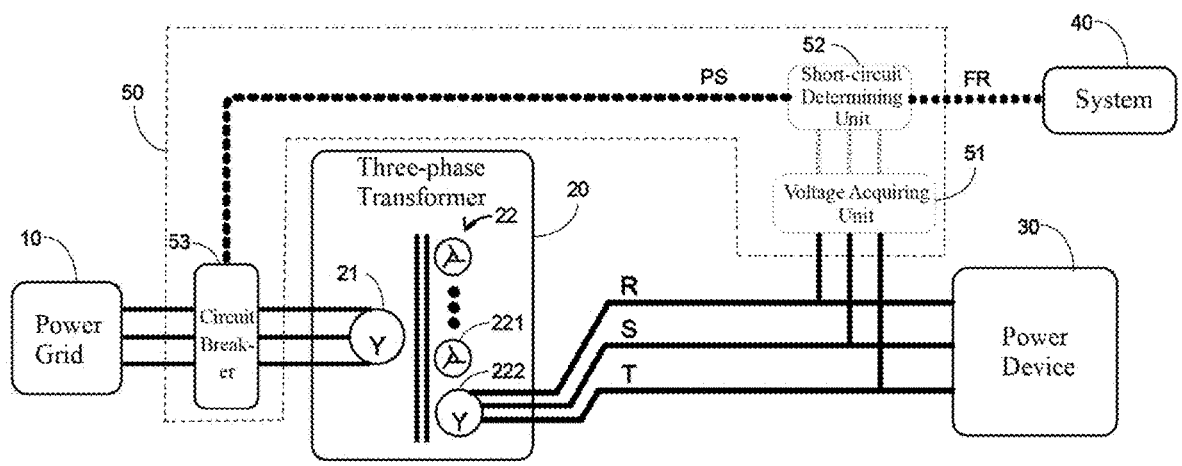
FIG. 3 is a flow diagram of a short-circuit protection method for a three-phase transformer according to the invention.
FIG. 4 is a structural diagram of a short-circuit protection device for a three-phase transformer according to the invention.

As shown in FIG. 3, a transformer short-circuit protection method 100 according to the invention includes:

Step S101, acquiring output voltages of a plurality of output lines of a winding on a low-voltage side of a transformer; and Step S102, determining a short circuit according to the output voltages in real time, and sending a protection signal when the short circuit is determined.

In the step S102, a plurality of line voltages are obtained by computing the voltage between any two of the plurality of output lines according to the output voltages. When variations of the plurality of line voltages satisfy short-circuit variation characteristics, the short circuit is determined. The short-circuit variation characteristics may include an amplitude characteristic. For example, an amplitude of one of the plurality of line voltages is varied to be less than or equal to a first characteristic value, an amplitude of any one of other line voltages is varied to be greater than or equal to a second characteristic value, and the first characteristic value is less than the second characteristic value. In other embodiments, the short-circuit variation characteristics may further include a phase characteristic. For example, a phase difference between two of other line voltages is within an angle range. The angle range may be such as, from 160° to 180°. The short-circuit variation characteristics may further include a sum of vectors of the plurality of line voltages always being zero.

As shown in FIG. 4, a transformer short-circuit protection device according to the invention may be applied to a power system. The power system, for example, may include a power grid 10, a three-phase transformer 20, a power device 30, an superior system 40 and a short-circuit protection device 50. A primary side 21 of the three-phase transformer 20 is a high-voltage side and receives power from the power grid 10. A secondary side 22 is a low-voltage side and has a plurality of secondary windings for supplying power to the power device 30. In the embodiment shown in FIG. 4, the primary side 21 has a Y-type primary winding, and a plurality of secondary windings of the secondary side 22 includes extended triangular secondary windings 221 and Y-type secondary windings 222. Only the short-circuit protection device 50 of the Y-type secondary winding 222 is illustrated, but it can be understood that other secondary winding can also be provided with the short-circuit protection device 50.

In the invention, the short-circuit protection device 50 includes a voltage acquiring unit 51, a short-circuit determining unit 52 and a controllable circuit breaker 53.

The voltage acquiring unit 51 includes voltage sensors for acquiring output voltages of a plurality of output lines of a winding on a low-voltage side of the transformer 20. For example, output voltages of output lines R, S and T of the Y-type secondary winding 222 may be sampled by the voltage sensors in real time, and the instantaneous values of the output voltages sampled in real time may be sent to the short-circuit determining unit 52. In other embodiments, the output voltages of the respective output lines can be acquired directly by the post-stage power device 30 having voltage sensing function.

The short-circuit determining unit 52, for example, may be a MCU having short-circuit protection function for performing computation and determining a short circuit according to the output voltages, and sending a protection signal PS when the short circuit is determined. The short-circuit determining unit 52 may compute a line voltage between any two of the plurality of output lines according to the output voltages to obtain a plurality of line voltages; and determine the short circuit when variation of the plurality of line voltages satisfy short-circuit variation characteristics. In the invention, when a short circuit occurs on the line, characteristics of line voltages varies, and the MCU will detect such variation and begin the determination of the short circuit. If variation of the line voltages satisfy the short-circuit variation characteristics, the short circuit is determined, and the MCU will send the protection signal PS immediately to the controllable circuit breaker 53 for short-circuit protection. Meanwhile, the short-circuit determining unit 52 may also be connected to the superior system 40, and reports a short circuit fault FR to the superior system 40 when the short circuit is determined.

The controllable circuit breaker 53 is disposed on a high-voltage side of the transformer 30 and connected to the short-circuit determining unit 52. And the controllable circuit breaker 53 cuts off a connection between the transformer 30 and the power grid 10 after receiving the protection signal PS, thereby providing a short-circuit protection for the post-stage. In other embodiments, the controllable circuit breaker 53 can be configured as a protective switch of other mechanism.

In some embodiments, the controllable circuit breaker can also be disposed in each secondary winding, which is connected and operating similarly as that of the controllable circuit breaker 53, so the details are omitted. In some other embodiments, the controllable circuit breakers can be disposed in both the primary winding and the secondary winding to improve the reliability.

Figure 5A:
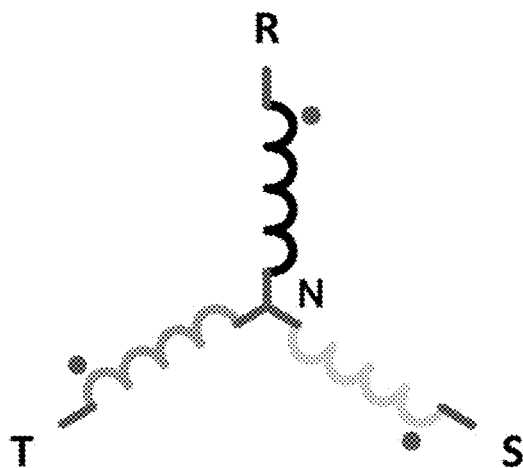
FIGS. 5A-5H are diagrams showing connection structures of multiple types of windings of a three-phase transformer according to the invention.
Figure 5B:
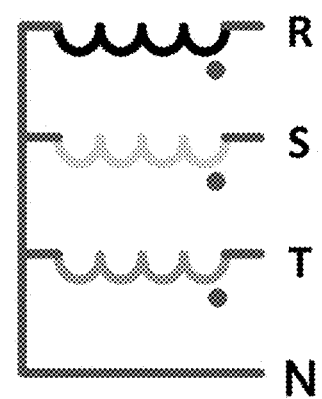
Figure 5C:
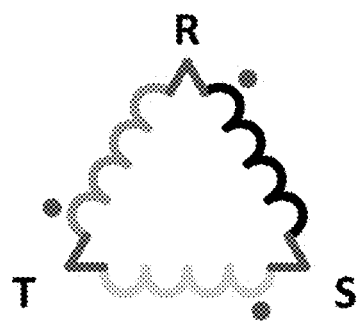
Figure 5D:
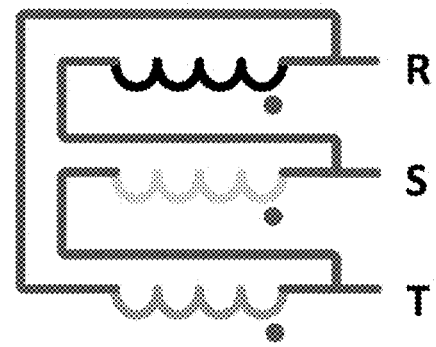
Figure 5E:
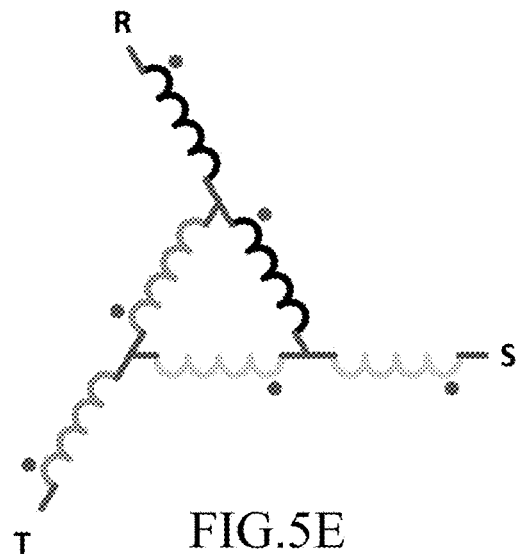
Figure 5F:
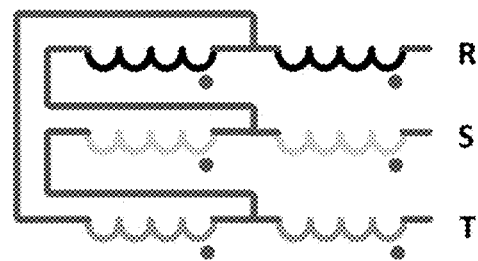
Figure 5G:
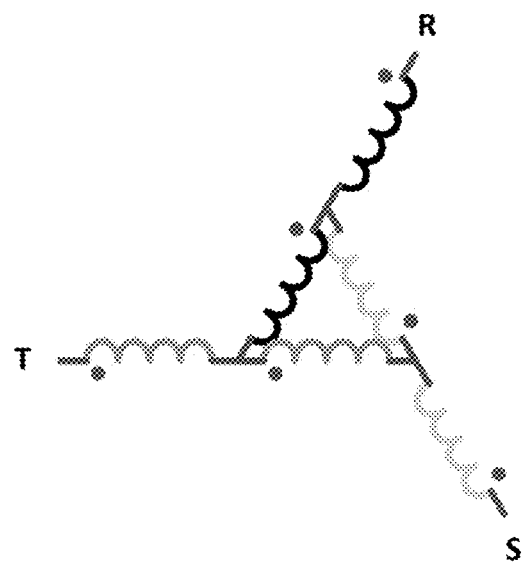
Figure 5H:
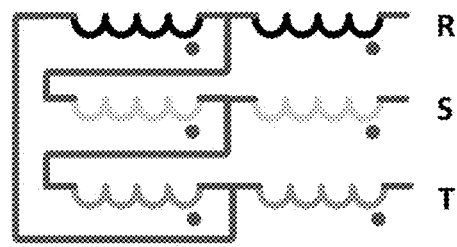

FIGS. 5A-5H show multiple connection structures of windings of a three-phase transformer according to the invention, respectively. FIG. 5A illustrates one connection structure of the winding, and FIG. 5B is a variation of FIG. 5A. As shown in FIGS. 5A and 5B, the coils of the winding are connected as a star, so the winding is called a Y-type winding. FIG. 5C illustrates another connection structure of the winding, and FIG. 5D is a variation of FIG. 5C. As shown in FIGS. 5C and 5D, the coils of the winding are connected as a triangle, so the winding is called a triangle winding. FIG. 5E illustrates another connection structure of the winding, and FIG. 5F is a variation of FIG. 5E. As shown in FIGS. 5E and 5F, the winding is combined by three coils and their extended coils, the three coils are connected as a triangle, and the winding is called an extended triangle winding with negative connection. FIG. 5G illustrates a connection structure of the winding with a positive connection, and FIG. 5H is a variation of FIG. 5G. As shown in FIGS. 5G and 5H, the winding is combined by three coils and their extended coils, the three coils are connected as a triangle, and the winding is called an extended triangle winding with positive connection.

Figure 6A:
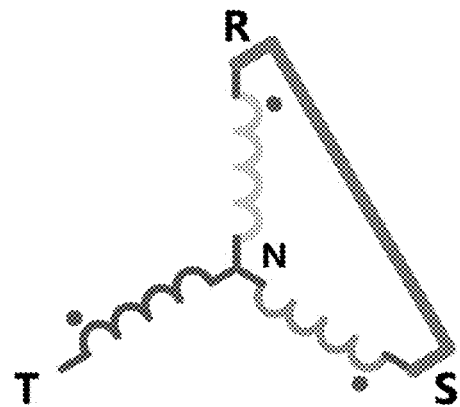
FIGS. 6A-6D show a line-to-line short circuit occurring on different types of windings of a three-phase transformer according to the invention, respectively.
Figure 6B:
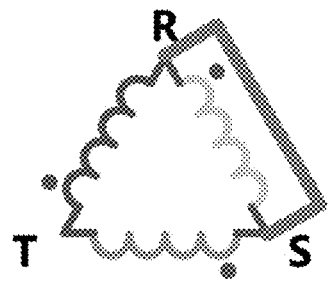
Figure 6C:
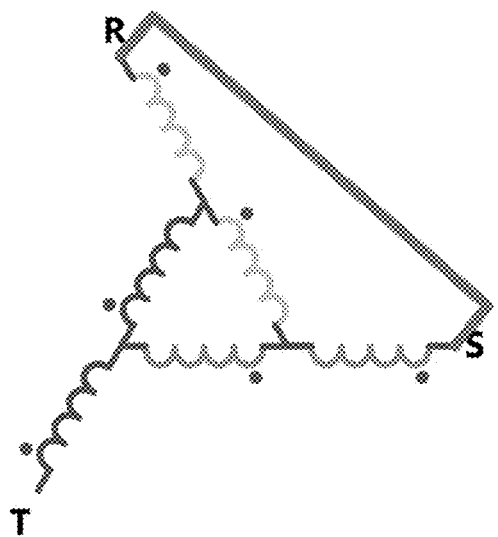
Figure 6D:
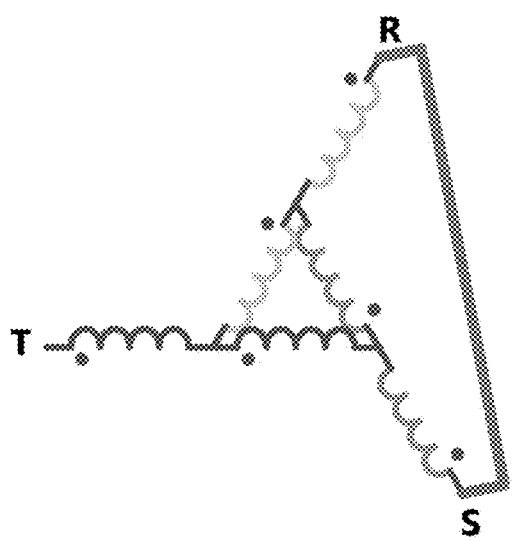

FIGS. 6A-6D show a line-to-line short circuit occurring on different types of windings of a three-phase transformer according to the invention, respectively. FIG. 6A illustrates a line-line short circuit, for example, R-S line short circuit, occurring on the Y-type winding. FIG. 6B illustrates a line-line short circuit, for example, R-S line short circuit, occurring on the triangle winding. FIG. 6C illustrates a line-line short circuit, for example, R-S line short circuit, occurring on the extended triangle winding with the negative connection. FIG. 6D illustrates a line-line short circuit, for example, R-S line short circuit, occurring on the extended triangle winding with the positive connection.

FIGS. 7A-7G show a phase short circuit or a partial winding short circuit occurring on different types of windings of a three-phase transformer according to the invention, respectively. FIG. 7A illustrates a phase short circuit, for example, the R phase short circuit, occurring on the Y-type winding. FIG. 7B illustrates a partial winding short circuit occurring on the extended triangle winding with the negative connection, for example, a short circuit occurring on an extended portion of the R phase. FIG. 7C illustrates a partial winding short circuit occurring on the extended triangle winding with the negative connection, for example, a short circuit occurring on a triangle portion of the R phase. FIG. 7D illustrates a phase short circuit, for example, the R phase short circuit occurring on the extended triangle winding with the negative connection. FIG. 7E illustrates a partial winding short circuit occurring on the extended triangle winding with the positive connection, for example, a short circuit occurring on an extended portion of the R phase. FIG. 7F illustrates a partial winding short circuit occurring on the extended triangle winding with the positive connection, for example, a short circuit occurring on a triangle portion of the R phase. FIG. 7G illustrates a phase short circuit, for example, the R phase short circuit, occurring on the extended triangle winding with the positive connection.

Embodiment 1: A Line-to-Line Short Circuit Detecting and Protecting for the Y-Type Winding Hereinafter, a short circuit occurring on the R-S line of the Y-type winding shown in FIG. 6A will be explained as an example to elaborate the short-circuit protection method according to one embodiment of the invention.

As shown in FIG. 6A, when a short circuit occurs on the R-S line of the Y-type winding, waveforms of the line voltages vary before and after the short circuit as shown in FIG. 8A. For example, after the R-S short circuit, the R-S line voltage Vrs is varied to 0, and the line voltages Vst and Vtr and the phases between other output lines are varied.

FIGS. 8B and 8C show vectors before and after the short circuit, respectively.

Moreover, variation characteristics of the line voltages before and after the short circuit satisfies Table 1:

TABLE 1

| State | Amplitude of the line voltage | | | Phase of the line voltage | | |
| --- | --- | --- | --- | --- | --- | --- |
| | Vrs | Vst | Vtr | θrs-st | θst-tr | θtr-rs |
| Before short circuit | Uo | Uo | Uo | 120° | 120° | 120° |
| After short circuit | 0 | 0.87Uo | 0.87Uo | 0 | 180° | 0 |

As can be seen from the Table 1, when the line-to-line short circuit occurs, the line voltages have the following variation characteristics:

(1) the amplitude of one line voltage (Vrs) is varied to 0, and amplitudes of other two line voltages (Vst and Vtr) are decreased to $\sqrt{3}/2$ (87%);

(2) a phase difference between the other two line voltages (Vst and Vtr) is varied to 180°;

(3) a sum of the vectors of the three line voltages is always zero.

In the invention, when the line-to-line short circuit occurs on the Y-type winding or other type windings, variation of the amplitudes and phases of the three line voltages satisfy the above variation characteristics. And a variation characteristic for line-to-line short circuit occurring on all type windings is that the amplitude of the line voltage of the short-circuited line is varied to 0, and the amplitudes of other two line voltages have certain values, so the short-circuit protection can be performed according to the variation characteristics.

FIG. 8D shows a method for determining a short circuit by detecting line voltages of the windings. The method includes:

(a) obtaining multiple line voltages, and respectively comparing amplitudes of the multiple line voltages with a first characteristic value VL and a second characteristic value VH; and (b) when an amplitude of one line voltage is less than or equal to the first characteristic value VL within a detection window time and an amplitude of any one of other line voltages is greater than or equal to the second characteristic value VH within the detection window time, determining the short circuit occurring.

Specifically, the method is designed as follows: (1) when an amplitude of one line voltage is detected to be less than or equal to a first characteristic value VL, recognizing an abnormality and beginning a determination of the short circuit; (2) detecting whether an amplitude of any one of other line voltages is greater than or equal to the second characteristic value VH; and (3) when both of (1) and (2) are always satisfied within the detection window time, determining the short circuit.

Through the above determining process, short-circuit protection can be performed by detecting line voltages.

In this embodiment, the first characteristic value VL and the second characteristic value VH are set as follows:

TABLE 2

| | Amplitude of line voltage | | |
| --- | --- | --- | --- |
| State | Vrs | Vst | Vtr |
| Before short circuit | Uo | Uo | Uo |
| After short circuit | 0 | 0.87Uo | 0.87Uo |

Table 2 shows amplitude variation of the line voltages in Embodiment 1 according to the variation characteristic of the line voltages. Uo is a rated voltage. The first characteristic value VL is 0 which corresponds to a minimum value of the line voltage after the short circuit, and the second characteristic value VH is 0.87*Uo which corresponds to a maximum value of the line voltage after the short circuit. In other embodiments, the first characteristic value VL may be set to Uo*5%, and the second characteristic value VH may be set to 0.87*Uo*80% to allow a certain margin.

In order to improve the reliability for determining the short circuit, the detection window time T is set to be not less than one cycle of an alternating current of the transformer. If the protection is not required to be relatively fast, a length of the detection window time T can be appropriately increased to improve the accuracy for determining the short circuit.

Figure 9:
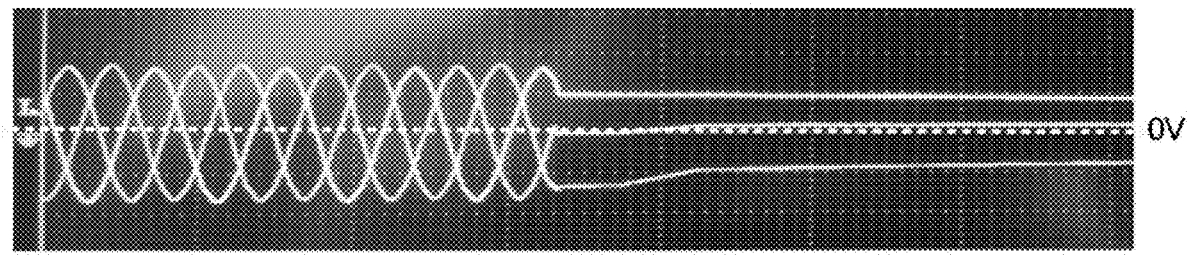
FIG. 9 is a schematic diagram showing an asynchronous decrease of output voltages of three output lines due to a Y capacitor in a post-stage device when one of secondary windings on a low-voltage side of a three-phase transformer is powered off.

Through the short-circuit protection method in Embodiment 1, the short circuit fault can be reliably detected. However, in some cases, a short circuit may be detected when there is no short circuit. As shown in FIG. 9, when one secondary winding of a three-phase transformer is powered off, the three line voltages are decreased asynchronously due to a Y capacitor in the post-stage device. At this time, the voltage amplitude varies similarly as that when the short circuit occurs, so the short-circuit protection may be triggered. As for such case, the system should continue to operate without performing short-circuit protection. Therefore, in order to improve the accuracy of short-circuit detection, phases of the line voltages will be additionally detected to prevent the erroneous protection.

Embodiment 2: A Partial Winding Short Circuit Detecting and Protecting for the Extended Triangle Winding Hereinafter, a short circuit occurring on an extended portion on R phase of the extended triangle winding shown in FIG. 7B will be explained as an example to elaborate the short-circuit protection method according to another embodiment of the invention.

Figure 10A:
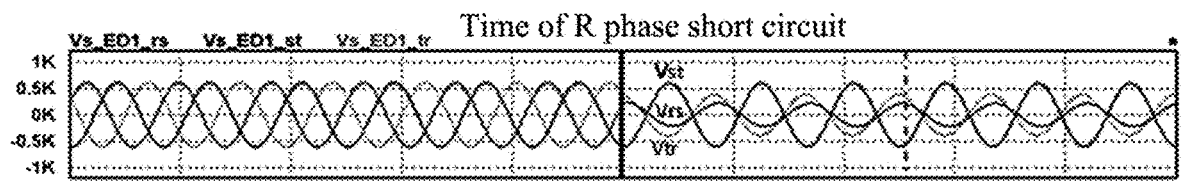
FIG. 10A is a waveform diagram showing a variation of line voltages between three output lines before and after a short circuit occurring on an extended winding portion of R phase of an extended triangular winding of a three-phase transformer as shown in FIG. 7B.

As shown in FIG. 7B, the extended triangle phase-shifting winding is combined by three coils connected as a triangle and their extended coils and a phase-shifting angle α is determined by a turn ratio of the coils and the extended coils. When a short circuit occurs on the extended portion of the R phase, the three line voltages varies before and after the short circuit as shown in FIG. 10A. The phase-shifting angle α is equal to −7.5°.

Figures 10B, 10C:
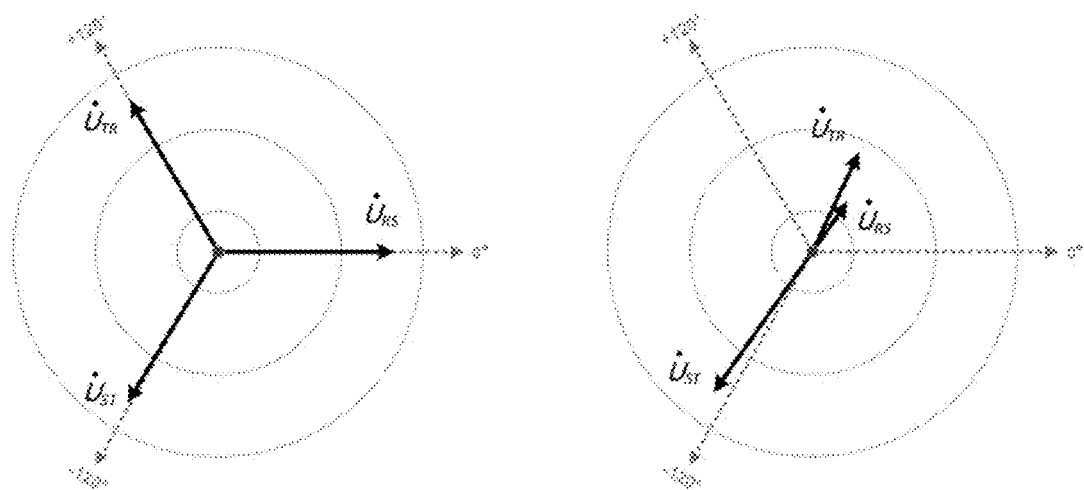
FIGS. 10B and 10C are diagrams showing vectors before and after the short circuit, respectively.

FIGS. 10B and 10C show vectors before and after the short circuit, respectively.

Moreover, variation characteristics of the line voltages before and after the short circuit satisfies Table 3:

TABLE 3

| State | Amplitude of line voltages | | | Phase of line voltages | | |
|---|---|---|---|---|---|---|
| | Vrs | Vst | Vtr | θrs-st | θst-tr | θtr-rs |
| Before short circuit | Uo | Uo | Uo | 120° | 120° | 120° |
| After short circuit | sin(30° − α)Uo | cos(α)Uo | sin(30° + α)Uo | 180° | 180° | 0 |

As can be seen from Table 3, the line voltages of the partial winding short circuit have the following variation characteristics:

(1) amplitude variations of the three line voltages are associated with the phase-shifting angle α, as shown in Table 3;

(2) a phase difference between two line voltages is about 180°;

(3) a sum of the vectors of the three line voltages is always zero.

In the invention, variations of the line voltages for the partial winding short circuit of the extended triangle phase-shifting winding satisfy the above variation characteristics. Meanwhile, the triangle winding and the Y-type winding may be considered as extended triangle windings having phase-shifting angles α of 30° and 0°. A general variation characteristic of the line voltages when the phase short circuit occurs may be induced as that an amplitude characteristic of (1) and a phase characteristic of (2) are satisfied. Therefore, the short-circuit protection can be performed accurately according to the variation characteristics.

The amplitude characteristic is determined in a same manner as that in Embodiment 1.

The phase characteristic is determined within the detection window time T through zero crossing detection (ZCD).

Figure 10D:
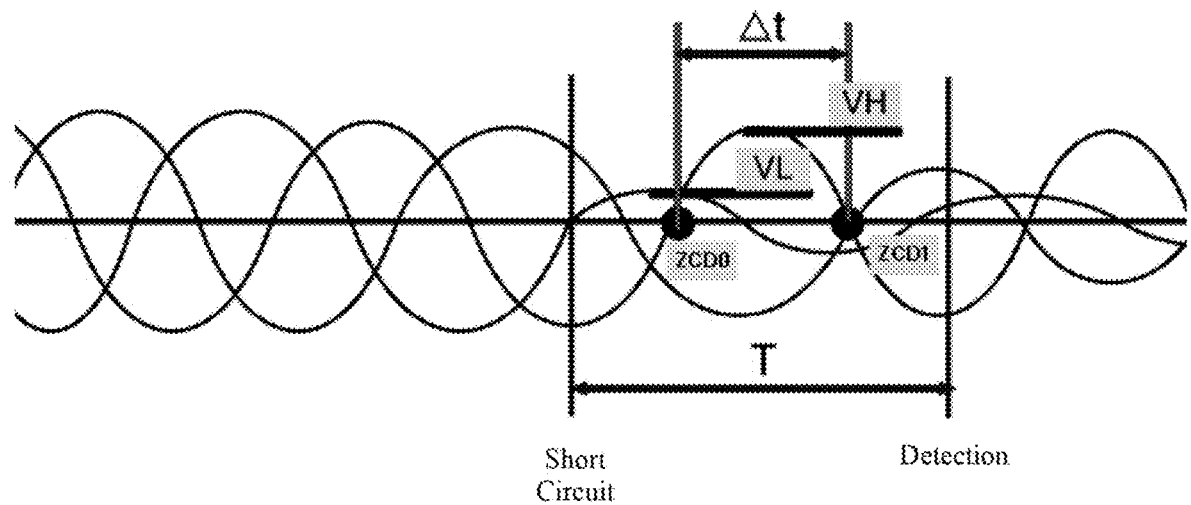
FIG. 10D is a schematic diagram showing a determination of a short circuit by detecting output voltages of output lines of a short-circuit winding.

FIG. 10D shows a method for determining a short circuit by detecting line voltages of the windings. The method includes:

(a) obtaining multiple line voltages, and respectively comparing amplitudes of the multiple line voltages with a first characteristic value VL and a second characteristic value VH;

(b) obtaining a time difference Δt between points of ZCD0 and ZCD1 at which other two line voltages cross zero in a same direction through the zero-crossing detection, computing a phase difference φ accordingly, and detecting whether the phase difference φ is within an angle range (for example about 180°); and (c) when an amplitude of one line voltage is less than or equal to the first characteristic value VL within a detection window time, an amplitude of any one of other line voltages is greater than or equal to the second characteristic value VH within the detection window time, and the phase difference φ is within an angle range once within the detection window time, determining the short circuit occurring.

Specifically, the method is designed as follows: (1) when an amplitude of one line voltage is detected to be less than or equal to a first characteristic value VL, recognizing an abnormality and beginning a determination of the short circuit; (2) detecting whether an amplitude of any one of other line voltages is greater than or equal to the second characteristic value VH; (3) obtaining a time difference Δt between points of ZCD0 and ZCD1 at which other two line voltages cross zero in a same direction through the zero-crossing detection, computing a phase difference φ accordingly, and detecting whether the phase difference φ is within an angle range (for example about 180°); and (4) when both of (1) and (2) are always satisfied within the detection window time, and (3) is satisfied once within the detection window time, determining the short circuit.

Through the above determining process, the short circuit fault can be accurately determined, thereby preventing the erroneous protection that may be generated by detecting only the voltage amplitude.

In this embodiment, the characteristics values are set as follows:

TABLE 4

| State | Amplitude of line voltage | | | Phase of line voltage | | |
|---|---|---|---|---|---|---|
| | Vrs | Vst | Vtr | θrs-st | θst-tr | θtr-rs |
| Before short circuit | Uo | Uo | Uo | 120° | 120° | 120° |
| After short circuit | 0.61Uo | 0.99Uo | 0.38Uo | ≈180° | ≈180° | 0 |

Table 4 shows amplitude variation and phase variation of the line voltages in Embodiment 2 according to the general variation characteristics of the line voltages. The first characteristic value VL is 0.38*Uo which corresponds to a minimum value of the line voltage after the short circuit, and the second characteristic value VH is 0.99*Uo which corresponds to a maximum value of the line voltage after the short circuit. In other embodiments, the first characteristic value VL may be set to 0.38*Uo*120%, and the second characteristic value VH may be set to 0.99*Uo*80% to allow a certain margin. Preferably, the phase characteristic is an angle range, such as, from 160° to 180°. The time difference Δt obtained through the zero crossing detection is converted into φ, and φ is obtained by the formula: φ=f×Δt×360°.

In order to improve the reliability for determining the short circuit, the detection window time T is set to be not less than one cycle of an alternating current of the transformer. If the protection is not required to be relatively fast, a length of the detection window time T can be appropriately increased to improve the accuracy for determining the short circuit.

In the invention, different types of short circuits correspond to different characteristic values, and if several types of short circuits are required to be determined, different characteristic values can be combined.

Figure 11:
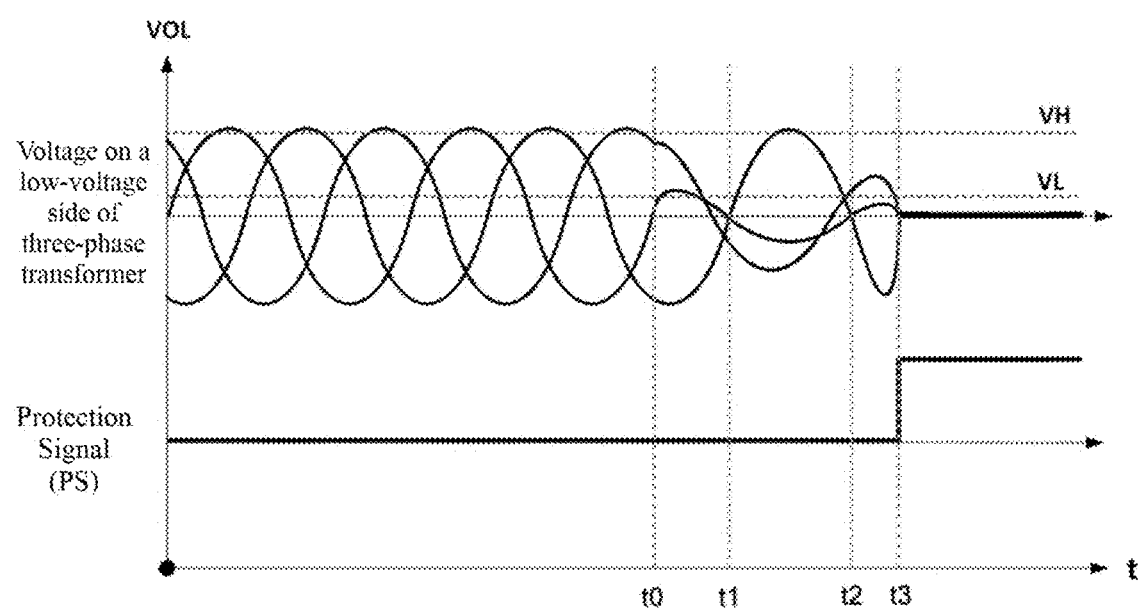
FIG. 11 is a schematic diagram showing a timing of signals in the embodiment as shown in FIG. 10D.

FIG. 11 shows a timing of signals in the present embodiment.

(1) Before t0, the system operates normally, and the three line voltages are rated values;

(2) at t0, a short circuit occurs, an amplitude of one line voltage is decreased and less than or equal to VL, a short-circuit protection program detects an abnormality to enable a short-circuit determining program, and the detection window time is T;

(3) at t1, one of other line voltages crossing a zero point in a positive direction is detected at ZCD0;

(4) at t2, another one of other line voltages crossing the zero point in the positive direction is detected at ZCD1, so the phase difference $\varphi$ is equal to $f \times (t2-t1) \times 360°$ which is within the angle range;

(5) before t3, the one line voltage is always less than VL, and another line voltage is always greater than VH;

(6) at t3, the detection window time T ends, and the detection is terminated;

(7) at t3, the determining program determines that the amplitude characteristic and the phase characteristic are satisfied, and the short circuit occurs, thereby sending a short-circuit protection signal PS. Specifically, the short-circuit protection signal PS is converted into a high level to trigger the hardware protection, and the input lines are disconnected. The three line voltages are decreased to 0 after t3.

The invention provides a transformer short-circuit protection method and a transformer short-circuit protection device based on voltage characteristics. A short-circuit protection for a three-phase transformer is realized by detecting the line voltages, thereby largely reducing the protection cost and improving the protection reliability.

As compared to the current detection of the prior art, the invention at least has the following advantages.

(1) The voltage sensor (divider type), when only performing short-circuit protection, has a lower cost than the current sensor, such that the cost is greatly reduced for a system having multiple windings. If a post-stage device (such as, a charger) has a function of sampling a voltage of power network in real time, the voltage sensor can be omitted. For example, the short-circuit protection can be performed by directly using the voltage sampled by the charger.

(2) The short-circuit protection according to the present invention can be performed through the voltage detection regardless of a position of the short circuit, particularly in a case that the conventional current detection is unfeasible.

(3) A release speed of an overcurrent of the circuit breaker is associated with an amplitude of the current, and the release speed may be slow when the current value is proximate to a protection threshold, thereby increasing a risk of the system. The voltage detection according to the present invention is performed by software, so the time and sensitivity for protection are controllable and stable.

(4) Various types of short circuits can be determined through parameter settings, so the application range is wide.

The software protection can be expanded to detection and protection of other abnormality, such as, PLL, OVP or UVP, using the sampled line voltages.

Exemplary embodiments of the invention have been shown and described in detail. It shall be understood that the invention is not limited to the disclosed embodiments. Instead, the invention intends to cover various modifications and equivalents included in the spirit and scope of the appended claims.

What is claimed is:

1. A transformer short-circuit protection method, comprises:
    acquiring output voltages of a plurality of output lines of at least one winding on a low-voltage side of a transformer;
    computing a plurality of line voltages between each two of the plurality of output lines according to the output voltages; and
    determining a short circuit when variations of the plurality of line voltages satisfy short-circuit variation characteristics, and sending a protection signal when the short circuit is determined,
    wherein the short-circuit variation characteristics comprise an amplitude characteristic in which an amplitude of one of the plurality of line voltages is less than or equal to a first characteristic value within a detection window time, an amplitude of any one of other line voltages is greater than or equal to a second characteristic value within the detection window time, and the first characteristic value is less than the second characteristic value.

2. The method of claim 1, wherein determining the short circuit comprises:
    (a) respectively comparing amplitudes of the plurality of line voltages with the first characteristic value and the second characteristic value; and
    (b) determining the short circuit occurring, when the amplitude characteristic is satisfied.

3. The method of claim 1, wherein the short-circuit variation characteristics further comprise a phase characteristic in which a phase difference between two of the other line voltages is within an angle range.

4. The method of claim 3, wherein determining the short circuit comprises: (a) respectively comparing amplitudes of the plurality of line voltages with the first characteristic value and the second characteristic value;
    (b) obtaining a time difference between points at which the other line voltages cross zero in a same direction through zero-crossing detection, computing a phase difference according to the time difference, and determining whether the phase difference is within the angle range; and
    (c) determining the short circuit occurring, when the amplitude characteristic is satisfied, and the phase characteristic is satisfied once within the detection window time.

5. The method of claim 1, wherein when the at least one winding is a Y-type winding, the first characteristic value is 0, and the second characteristic value is 0.87*Uo; or
    the first characteristic value is Uo*5%, and the second characteristic value is 0.87*Uo*80%;
    wherein Uo is a rated voltage.

6. The method of claim 1, wherein when the at least one winding is an extended triangular winding, the first characteristic value is 0.38*Uo, and the second characteristic value is 0.99*Uo; or the first characteristic value is 0.38*Uo*120%, and the second characteristic value is 0.99*Uo*80%;
wherein Uo is a rated voltage.

7. The method of claim 1, wherein the protection signal is sent to a controllable circuit breaker on a high-voltage side of the transformer, and the controllable circuit breaker cuts off a connection between the transformer and a power grid after receiving the protection signal.

8. The method of claim 1, wherein the short-circuit variation characteristics further comprise a sum of vectors of the plurality of line voltages always being zero.

9. A transformer short-circuit protection device, comprises:
a voltage acquiring unit for acquiring output voltages of a plurality of output lines of at least one winding on a low-voltage side of a transformer;
a short-circuit determining unit for obtaining a plurality of line voltages between each two of the plurality of output lines according to the output voltages, determining a short circuit when variations of the plurality of line voltages satisfy short-circuit variation characteristics, and sending a protection signal when the short circuit is determined; and
a controllable circuit breaker disposed on a high-voltage side of the transformer and connected to the short-circuit determining unit, for cutting off a connection between the transformer and a power grid after receiving the protection signal,
wherein the short-circuit variation characteristics comprise an amplitude characteristic in which an amplitude of one of the plurality of line voltages is less than or equal to a first characteristic value within a detection window time, an amplitude of any one of other line voltages is greater than or equal to a second characteristic value within the detection window time, and the first characteristic value is less than the second characteristic value.

10. The device of claim 9, wherein the short-circuit determining unit is connected to a superior system, and configured to report a short circuit fault to the superior system when the short circuit is determined.

11. The device of claim 9, wherein the short-circuit determining unit is configured to:
(a) respectively compare amplitudes of the plurality of line voltages with the first characteristic value and the second characteristic value; and
(b) determine the short circuit occurring, when the amplitude characteristic is satisfied.

12. The device of claim 9, wherein the short-circuit variation characteristics further comprise a phase characteristic in which a phase difference between two of the other line voltages is within an angle range.

13. The device of claim 12, wherein the short-circuit determining unit is configured to:
(a) respectively compare amplitudes of the plurality of line voltages with the first characteristic value and the second characteristic value;
(b) obtain a time difference between points at which the other line voltages cross zero in a same direction through zero-crossing detection, computing a phase difference according to the time difference, and determining whether the phase difference is within the angle range; and
(c) determine the short circuit occurring, when the amplitude characteristic is satisfied, and the phase characteristic is satisfied once within the detection window time.

14. The device of claim 9, wherein when the at least one winding is a Y-type winding, the first characteristic value is 0, and the second characteristic value is 0.87*Uo; or
the first characteristic value is Uo*5%, and the second characteristic value is 0.87*Uo*80%;
wherein Uo is a rated voltage.

15. The device of claim 9, wherein when the at least one winding is an extended triangular winding, the first characteristic value is 0.38*Uo, and the second characteristic value is 0.99*Uo; or
the first characteristic value is 0.38*Uo*120%, and the second characteristic value is 0.99*Uo*80%;
wherein Uo is a rated voltage.

16. The device of claim 9, wherein the short-circuit variation characteristics further comprise a sum of vectors of the plurality of line voltages always being zero.

* * * * *